US008296119B2

(12) United States Patent
Larue, Jr. et al.

(10) Patent No.: US 8,296,119 B2
(45) Date of Patent: Oct. 23, 2012

(54) SAVING AND RESTARTING DISCRETE EVENT SIMULATIONS

(75) Inventors: William W. Larue, Jr., Leawood, KS (US); Neeti K. Bhatnagar, San Jose, CA (US); George F. Frazier, Lawrence, KS (US); Andrew R. Wilmot, Carlisle, MA (US)

(73) Assignee: Cadence Design Systems, Inc., San Jose, CA (US)

( * ) Notice: Subject to any disclaimer, the term of this patent is extended or adjusted under 35 U.S.C. 154(b) by 640 days.

(21) Appl. No.: 11/935,308

(22) Filed: Nov. 5, 2007

(65) Prior Publication Data

US 2009/0119310 A1 May 7, 2009

(51) Int. Cl.
*G06F 17/50* (2006.01)
(52) U.S. Cl. ......................................................... 703/14
(58) Field of Classification Search ................... 703/13, 703/14, 16, 17
See application file for complete search history.

(56) References Cited

U.S. PATENT DOCUMENTS

| | | | | |
|---|---|---|---|---|
| 6,077,304 | A * | 6/2000 | Kasuya | 703/14 |
| 2004/0243375 | A1* | 12/2004 | Kundert | 703/14 |
| 2005/0216248 | A1* | 9/2005 | Ciolfi et al. | 703/22 |
| 2006/0036426 | A1* | 2/2006 | Barr et al. | 703/22 |
| 2006/0195825 | A1* | 8/2006 | Vanspauwen et al. | 717/135 |

OTHER PUBLICATIONS

Zhang Y., et al., "A Checkpointing/Recovery System for MPI Applications on Cluster of IA-64 Computers", Proceedings of the 2005 International Conference on Parallel Processing Workshops, IEEE Computer Society, Jun. 14-17, 2005, pp. 320-327.

* cited by examiner

*Primary Examiner* — Dwin M Craig
*Assistant Examiner* — Andre Pierre Louis
(74) *Attorney, Agent, or Firm* — Sawyer Law Group, P.C.

(57) ABSTRACT

Method, system, and computer program product for saving and restarting discrete event simulations are provided. A discrete event simulation of a scenario is performed via a process executing on a system. The process includes one or more application threads. A checkpoint of the process is created at a point in time when a command to save the discrete event simulation of the scenario is received. The checkpoint includes data elements of the process and the one or more application threads of the process that are stored in components of the system at the point in time. These data elements reflect a state of the process and the one or more application threads of the process at the point in time. The checkpoint is saved to one or more files in the system that are usable to later restart the discrete event simulation of the scenario from the point in time.

19 Claims, 6 Drawing Sheets

SAVING AND RESTARTING DISCRETE EVENT SIMULATIONS

BACKGROUND

It is sometimes desirable to save performances of discrete event simulations up to particular points in time and then later restart the performances of the discrete event simulations from the particular points in time. Performance of a discrete event simulation up to a particular point in time can be saved by saving every simulation variable value of a simulator performing the discrete event simulation at the particular point in time. Collectively, the value assigned to each simulation variable at the particular point in time reflects a state of the simulator at the particular point in time.

Saving every simulation variable value of a simulator, however, requires complete implementation details regarding the simulator and any application thread employed by the simulator. This type of information, however, is usually not available. Without such information, it will not be possible to save a state of the simulator at a particular point in time during performance of a discrete event simulation. As a result, it will be impossible to restart performance of the discrete event simulation from the particular point in time.

SUMMARY

Method, system, and computer program product for saving and restarting discrete event simulations are provided. In one implementation, a discrete event simulation of a scenario is performed via a process executing on a system, the process including one or more application threads, responsive to a command to save the discrete event simulation of the scenario up to a point in time, a checkpoint of the process at the point in time is created to capture the discrete event simulation of the scenario up to the point in time, the checkpoint including data elements of the process and the one or more application threads of the process that are stored in components of the system at the point in time which reflect a state of the process and the one or more application threads of the process at the point in time, and the checkpoint is saved to one or more files in the system, the one or more files being usable to later restart the discrete event simulation of the scenario from the point in time.

DETAILED DESCRIPTION

Figure 1:
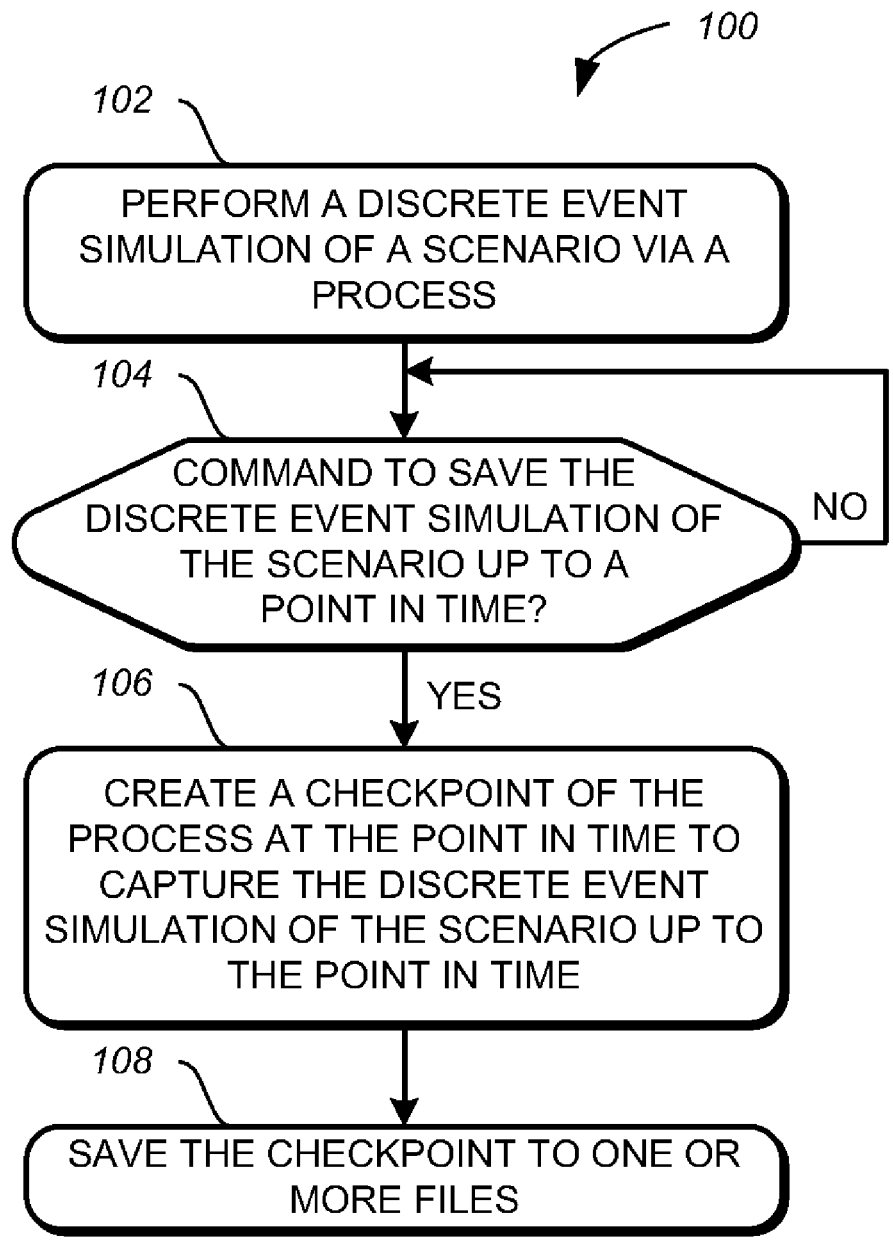
FIG. 1 depicts is a method for saving and restarting discrete event simulations according to an implementation.

This disclosure generally relates to discrete event simulations, and more particularly to saving and restarting discrete event simulations. The following description is provided in the context of a patent application and its requirements. Accordingly, this disclosure is not intended to be limited to the implementations shown, but is to be accorded the widest scope consistent with the principles and features described herein.

Discrete event simulation (DES) is a way to simulate scenarios to determine what could happen if the scenarios were to occur in real life. A scenario includes a collection of entities, such as components of a computer, roads and highways in a city, tellers and customer queues in a bank, trees and other plant life in a forest, or the like. A scenario also includes a set of events involving one or more entities in the scenario. The set of events usually includes events likely to alter an outcome of the scenario.

For example, suppose a forest fire is the scenario being simulated. Entities in the scenario could include trees, one or more fires, firefighters, firefighting aircrafts, and so forth. Events in the scenario could include, for instance, temperature increasing, wind speed increasing to, wind direction changing, humidity decreasing, increasing the number of firefighters, etc. Thus, discrete event simulation has a wide application from simulating performance of a microprocessor and operation of a computer to simulating traffic flow through a city and wait time at a drive-through.

Simulation can be used to obtain information or to validate/invalidate a hypothesis about scenarios being simulated. Discrete event simulation is generally iterative in nature. For example, a common sequence of events may be simulated multiple times during a simulation session. Time is central to the concept of DES. A state of a simulation may be investigated periodically. Individual simulations can run on systems, such as computers and other data processing devices, for long periods of time (e.g., days, weeks, or months).

Parallelism is important when simulating certain scenarios. For example, when simulating a complex scenario, such as a computer system with many components that run in parallel, it is important to emulate the behavior of these components. Simulation is usually a single process comprising one or more executable files. The single process runs on a system that can only simulate one event at a time even though, in reality, multiple events may occur in the complex scenario simultaneously.

There are several approaches to emulating parallelism in a simulation. One approach is to use threads of control within a single process. A thread is a semi-process that has its own stack (e.g., a section of memory) that executes code. Threads typically run on a processor for an amount of time before yielding to another thread, which in turn runs on the processor for a period of time. Some programming languages used for simulation, such as Verilog and SystemC, have the notion of threads built into the syntax.

Simulators can implement threads in several ways. One way is to use a private schema. Another way is to use an application thread package that is commercially distributed or available as open source. Application threads differ from system threads in that an application running on an operating system has privileges to create and use application threads available from software libraries, but not system threads. System threads are reserved for the operating system itself.

Implementation details of application threads are usually hidden in software libraries. Function calls through application programming interfaces (APIs) can be used to control the application threads. POSIX (Portable Operating System Interface based on Unix) threads is one example of a standard set of APIs used for portable multithreaded programming. Other examples of application threading packages include, for instance, FastThreads, QuickThreads, NewThreads, and so forth.

Being able to save and restart discrete event simulations is often desirable. To give an example, suppose a discrete event simulation involves a microprocessor. In the real world, booting a microprocessor may take several minutes, while running an application on the microprocessor after it has booted may take less than a second. In a discrete event simulation, it may take more than one day to simulate the microprocessor booting and only a few minutes to simulate the application running on the microprocessor.

If the state of the discrete event simulation is saved immediately after simulation of the microprocessor booting is completed, then instead of spending a day or more to re-simulate booting of the microprocessor in order to simulate running of the application on the microprocessor, the discrete event simulation can be restarted from the saved state. Restarting a simulation from a saved point should take less time than re-performing the simulation up to the saved point.

A programmatic approach can be used to save and restart a simulation. For example, functions can be written to exhaustively save the value of each simulation variable in a simulator when a save is desired and to restore the values of the simulation variables in the simulator that were saved when a restart is desired. The approach is programmatic in the sense that the actual act of saving and restarting is made possible by writing functions that save simulation variable values and assign values to simulation variables in order to return a simulator to its previous state.

Functions to save simulation variable values and to assign values to simulation variables, however, cannot be written without a complete understanding of the simulator and any application thread that may be used by the simulator. The implementation details that are necessary to gain a complete understanding of the simulator and any application thread that may be used by the simulator are rarely available.

To give an example, when application threads are used, each application thread has a local storage that is not accessible from the simulator or other threads. Oftentimes, threads are blocked while waiting on events and cannot be unblocked to access their internal state without changing the simulation results. Hence, it may be impossible to use a programmatic approach to save a discrete event simulation for a later restart.

Depicted in FIG. 1 is a method 100 for saving and restarting event simulations according to an implementation. At 102, a discrete event simulation of a scenario is performed via a process executing on a system. The process may be the result of one or more executable files running on the system. The process includes one or more application threads, which may be used to emulate parallelism.

The scenario may include a plurality of entities and a plurality of events. Each event may involve one or more of the plurality of entities. In one implementation, each entity in the scenario is a part of an integrated circuit design. The system may be a computer or any other data processing device.

A determination is made at 104 as to whether a command to save the discrete event simulation of the scenario up to a point in time has been processed. The command may be a command that is inputted by a user during the discrete event simulation. In one implementation, the command to save the discrete event simulation of the scenario is read from a file. The file may include one or more other commands, such as a command to perform the discrete event simulation.

If a save command has not been processed, then method 100 returns to process block 104 to check again. There may be a preset waiting period before checking again for a save command. If a save command has been processed, a checkpoint of the process at the point in time is created at 106 to capture the discrete event simulation of the scenario up to the point in time.

The checkpoint of the process comprises data elements of the process and the one or more application threads of the process that are stored in components of the system at the point in time which reflect a state of the process and the one or more application threads of the process at the point in time. For example, the checkpoint may include data elements of the process and the one or more application threads of the process that are stored in registers, memories, file handles, sockets, buffers, seeks, and the like of the system. Thus, a checkpoint of a process running on a system includes complete information describing the process and its application threads.

The checkpoint is saved to one or more files in the system at 108. In one implementation, the one or more files are executable files. The one or more files may simply be data files that can be read by a program to carry out discrete event simulation of the scenario from the point in time. The one or more files may be stored in, for instance, a disk of the system.

Although a checkpoint of the process is created and saved at the point in time, the discrete event simulation of the scenario may continue on past the point in time. Thus, the one or more files are usable to later restart the discrete event simulation of the scenario from the point in time, regardless of whether the discrete event simulation of the scenario from which the checkpoint was created continued past the point in time.

Different operating systems have different executable file formats for executables, object code, shared objects, core dumps, and so forth. Depending on which operating system is running on the system and which architecture is employed by the system, the executable file may be in ELF (Executable and Linking Format), COFF (Common Object File Format), PE COFF (Portable Executable COFF), a.out, or the like.

By conceptualizing performance of a discrete event simulation as a single process running on a system, a state of the process and any application threads that are part of the process can be saved by creating a checkpoint of the process. The checkpoint of the process includes data elements of the process and its application threads, which are stored in components of the system, such as registers, memories, file handles, or the like. These data elements comprise the state of the process and its application threads. As a result, complete knowledge of the implementation details concerning the process and its application threads is no longer necessary in order to save and restart the discrete event simulation.

Figure 2:
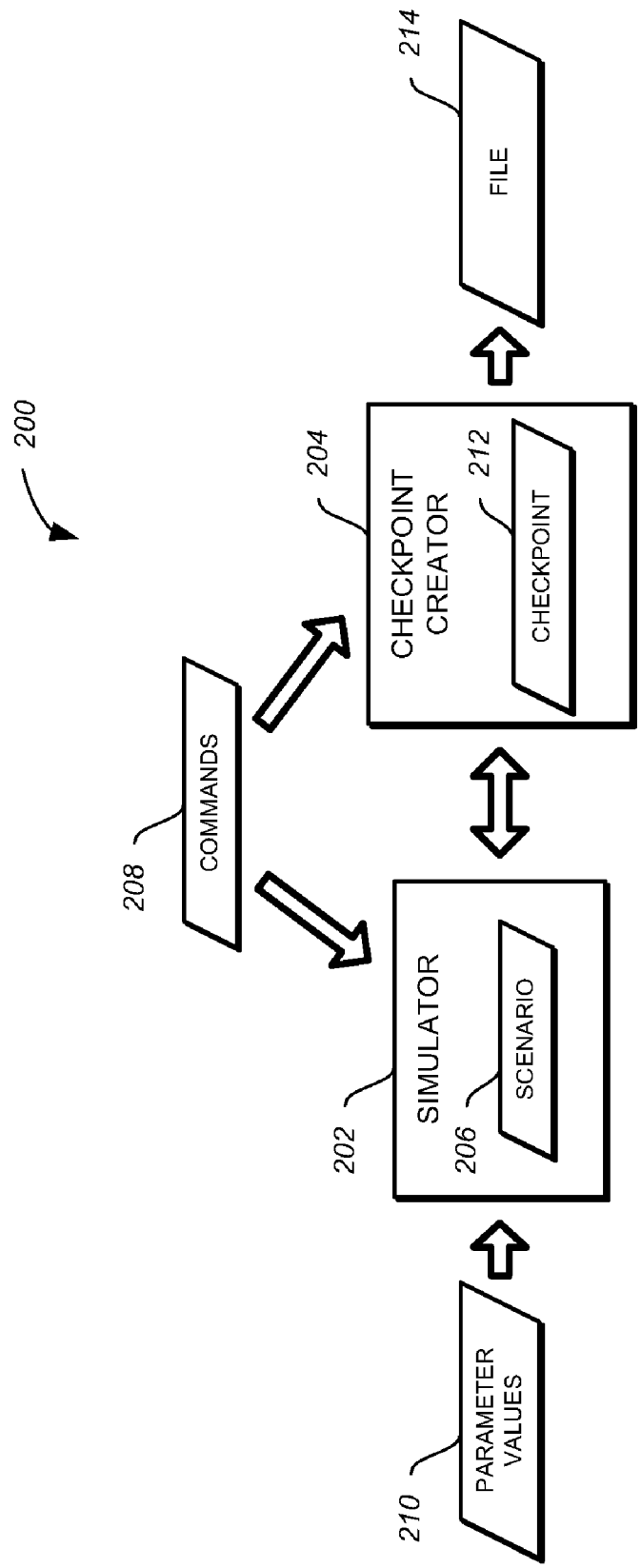
FIG. 2 illustrates a system for saving and restarting discrete event simulations according to an implementation.

FIG. 2 illustrates a system 200 for saving and restarting discrete event simulations according to an implementation. System 200 includes a simulator 202 executing on system 200 as a first process. Simulator 202 can be expressed as a group of one or more executable files that are running on system 200 as the first process. A checkpoint creator 204 is also included in system 200. Checkpoint creator 204 is executing on system 200 as a second process.

Simulator 202 is performing a discrete event simulation of a scenario 206. When performing the discrete event simulation of scenario 206, simulator 202 may utilize one or more application threads (not shown) to emulate parallelism. Performance of the discrete event simulation may be in response to a command 208. Command 208 may be inputted by a user, read from a file, or the like. In one implementation, scenario 206 comprises a plurality of entities and a plurality of events. Each event may involve one or more of the plurality of entities.

Each entity and each event may include one or more parameters. For example, suppose scenario 206 is a microprocessor. One of the entities in scenario 206 could be a level 1 cache. Hence, a parameter of the entity could be an amount of cache (e.g., 2 MB). One of the events of scenario 206 could be changing the operating temperature of the microprocessor. Thus, parameters of the event could be an amount of change (e.g., 1° F.) and whether the change is a plus or a minus. As a result, when simulator 202 performs the discrete event simulation of scenario 206, one or more parameter values 210 may be inputted, such as, through a command line interface, read from a file, or the like.

In response to a command 208 to save the discrete event simulation of scenario 206 up to a point in time, checkpoint creator 204 creates a checkpoint 212 of the first process at the point in time to capture the discrete event simulation of scenario 206 up to the point in time and saves checkpoint 212 to one or more files 214 stored in system 200. Files 214 may be executable files, data files, or the like. As noted above, command 208 may be inputted through a command interface, read from a file, or something else.

Checkpoint 212 of the first process includes data elements of the first process and the one or more application threads of the first process that are stored in components of system 200 at the point in time. For example, if system 200 is a computer, then data elements of the first process and the one or more application threads of the first process may be stored in memories, registers, file handles, buffers, sockets, etc. of the computer. Data elements included in checkpoint 212 reflect a state of simulator 202 at the point in time because they reflect a state of the first process and the one or more application threads of the first process at the point in time.

The discrete event simulation of scenario 206 may continue even after checkpoint 212 is created. Once the discrete event simulation is finished, terminated, or the like, the first process associated with simulator 202 will stop running on system 200. To restart the discrete event simulation of scenario 206 from the point in time, the one or more files 214 stored on system 200 may be executed. In one implementation, execution of the one or more files 214 results in a new process executing on system 200 that includes one or more application threads. The new process and the one or more application threads replicate the state of the first process and the one or more application threads of the first process at the point in time.

When restarting the discrete event simulation of scenario 206 from the point in time, at least one of the parameter values 210 may be changed from the one used during the discrete event simulation of scenario 206 up to the point in time. For instance, different parameters values 210 may be inputted, a different file with different parameter values may be used, one or more parameter values in a file previously used may be changed, or the like.

Figure 3:
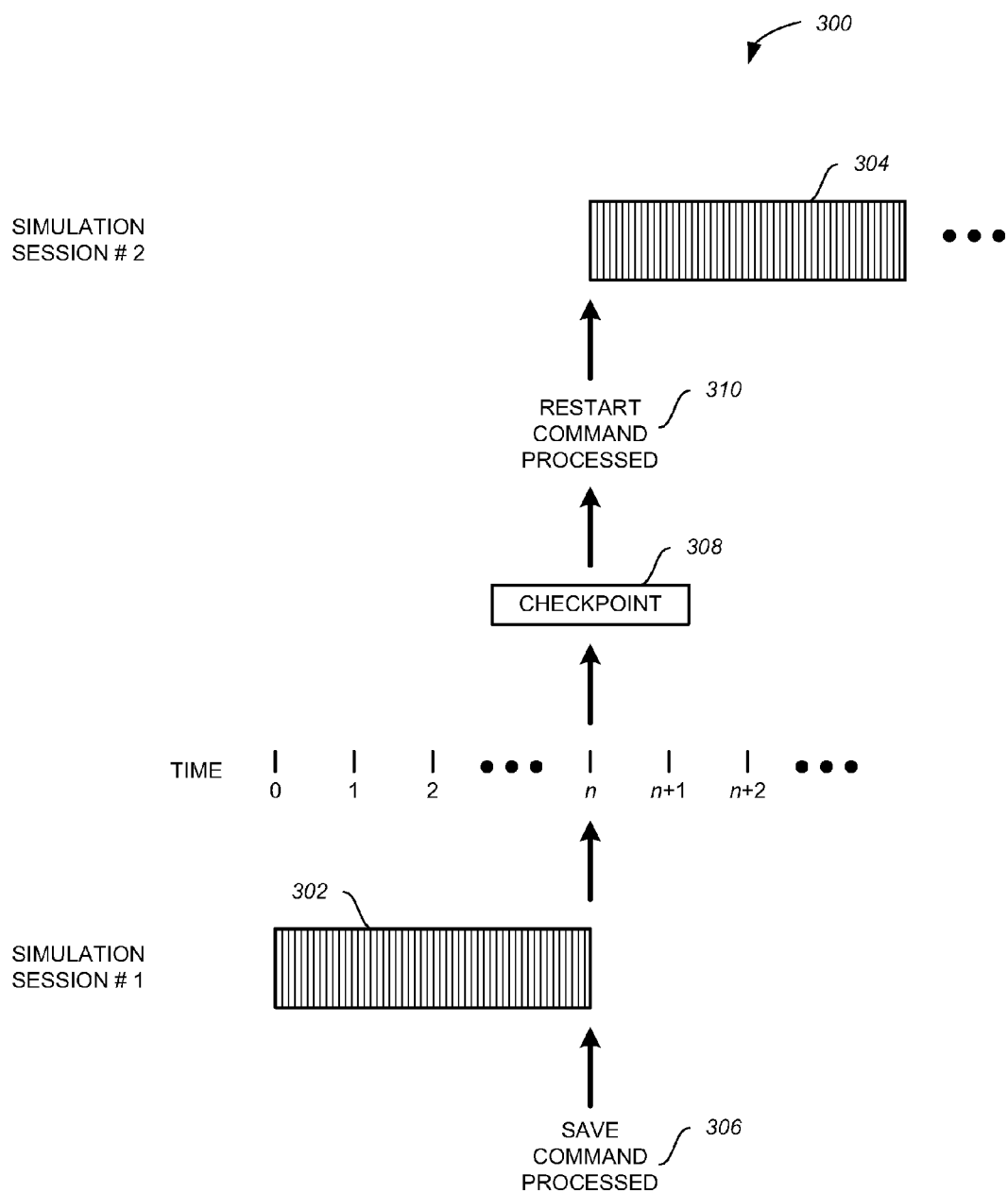
FIG. 3 shows an example of a simulator saving and restarting a discrete event simulation over multiple simulation sessions.

Checkpoint creator 204 may be incorporated into simulator 202, i.e., the first process and the second process may be combined into a single process executing on system 200. Shown in FIG. 3 is an example of a simulator 300 saving and restarting a discrete event simulation over simulation sessions 302 and 304. Simulation session 302 starts at time zero. At time n, a save command 306 is processed. In response to save command 306, a checkpoint 308 of simulator 300 is created. After a restart command 310 is processed, simulation session 304 restarts the discrete event simulation at time n.

As an example, the following commands may be included in a file that will be read by a simulator.
Run 1000 ns
Save x
Run 20 ns
Exit After reading the first command, the simulator will perform a discrete event simulation for 1000 nanoseconds. In response to the second command, the simulator will save its state at that time. The simulator will then run the discrete event simulation for another 20 nanoseconds in a second simulation session and then exit responsive to the third and fourth commands. A new simulation session may be started thereafter from the point at which the discrete event simulation was saved.

In the new simulation session, it is possible to allow the simulator to start with parameter values that are different from the parameter values that were used previously. If parameter values are read from a file previously, then contents of the file can be changed before the file is used for the new simulation session. Therefore, the simulator is not limited to merely being suspended and then later resumed.

The simulator can be expressed as a collection of executable files that run on a computer in a process. All application threads utilized by the simulator run in that process. Hence, a checkpoint of the process includes complete information about the process and its application threads. This may include information about registers, memories, file handles, seeks, sockets, and so forth.

Figure 4:
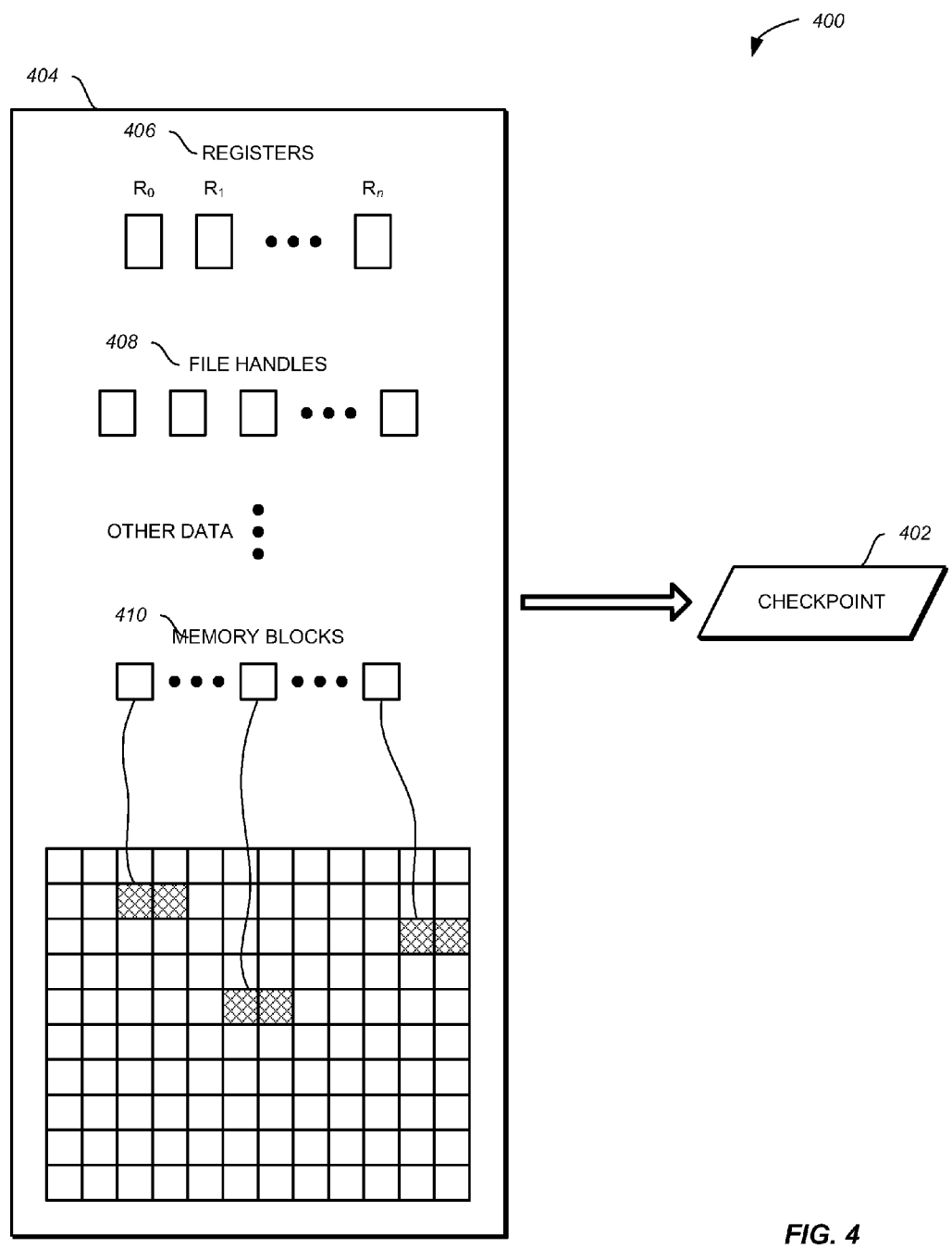
FIG. 4 depicts an example of a checkpoint creator creating a checkpoint from data elements of a process.

FIG. 4 depicts an example of a checkpoint creator 400 creating a checkpoint 402 from data elements 404 of a simulation process that are stored in various components 406-410 of a system. As seen in FIG. 4, data elements 404 of the simulation process are stored in registers 406, file handles 408, memory blocks 410, and other components of the system (not shown). Data elements 404 describe not only the simulation process, but also any application threads used by the simulation process. In particular, data elements 404 represent values assigned to variables of the simulation process and its application threads.

Since the values assigned to the variables of the simulation process and its application threads at a point in time represents a state of the simulation process at the point in time, creating checkpoint 402 from data elements 404 at the point in time captures the state of the simulation process and its application threads at the point in time. Accordingly, complete information about the simulation process and any application thread employed by the simulation process can be captured without details regarding how the simulation process and its application threads are implemented.

Figure 5:
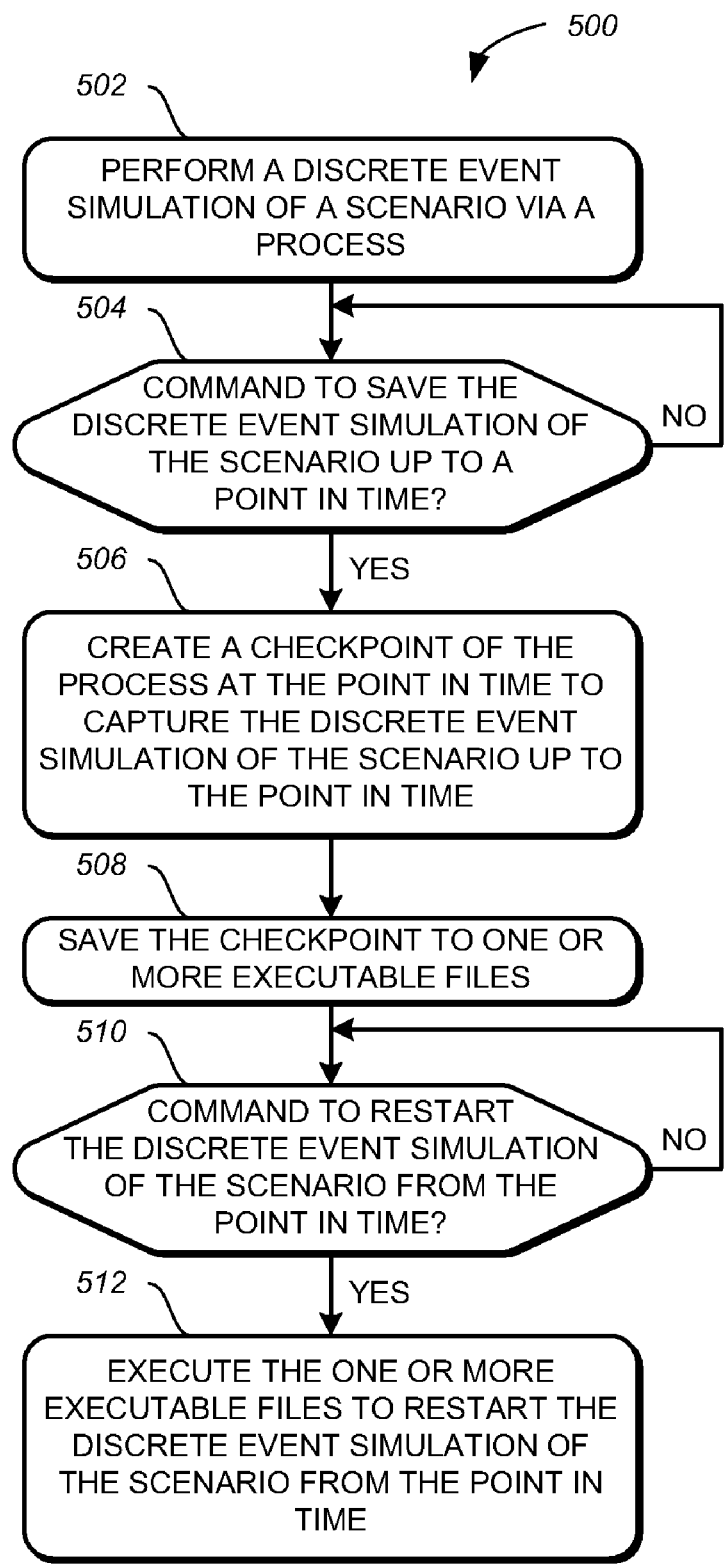
FIG. 5 illustrates a method for saving and restarting discrete event simulations according to an implementation.

Illustrated in FIG. 5 is a method 500 for saving and restarting discrete event simulations according to an implementation. At 502, a discrete event simulation of a scenario is performed via a process executing on a system. A determination is made at 504 as to whether a command to save the discrete event simulation of the scenario up to a point in time has been processed. If such a command has not been processed, the method 500 waits a predetermined period of time before checking again.

However, if such a command has been processed, then at 506, a checkpoint of the process at the point in time is created to capture the discrete event simulation of the scenario up to the point in time. At 508, the checkpoint is saved as one or more executable files. A determination is made at 510 as to whether a command to restart the discrete event simulation of the scenario from the point in time has been processed.

If no such command has been processed, then method 500 waits a predetermined period of time before checking again. If such a command has been processed, then at 512, the one or more executable files are executed to restart the discrete event simulation of the scenario from the point in time. In one implementation, execution of the one or more executable files results in a new process that replicates a state of the process at the point in time when the checkpoint of the process was created.

Commands to create the checkpoint and execute the one or more executable files may both be saved in a file, but not necessarily the same file. The discrete event simulation of the scenario may be restarted with at least one parameter of the scenario having a value that is different from a value assigned to the at least one parameter during the discrete event simulation of the scenario from which the checkpoint was created.

This disclosure can take the form of an entirely hardware implementation, an entirely software implementation, or an implementation containing both hardware and software elements. In one implementation, this disclosure is implemented in software, which includes, but is not limited to, application software, firmware, resident software, microcode, etc.

Furthermore, this disclosure can take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include DVD, compact disk-read-only memory (CD-ROM), and compact disk-read/write (CD-R/W).

Figure 6:
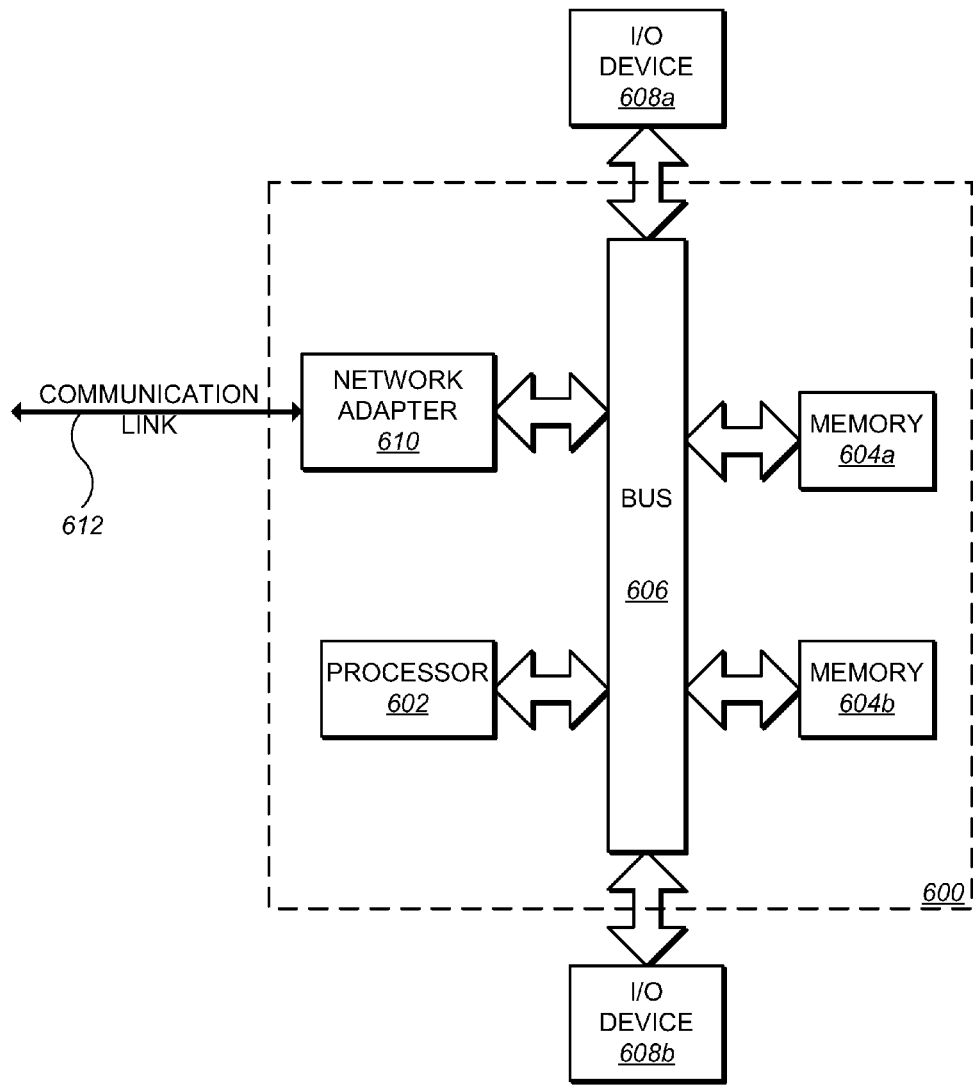
FIG. 6 is a block diagram of a system with which implementations of this disclosure can be implemented.

FIG. 6 is a system 600 suitable for storing and/or executing program code. System 600 includes a processor 602 coupled to memory elements 604a-b through a system bus 606. In other implementations, system 600 may include more than one processor and each processor may be coupled directly or indirectly to one or more memory elements through a system bus.

Memory elements 604a-b can include local memory employed during actual execution of the program code, bulk storage, and cache memories that provide temporary storage of at least some program code in order to reduce the number of times the code must be retrieved from bulk storage during execution. As shown, input/output or I/O devices 608a-b (including, but not limited to, keyboards, displays, pointing devices, etc.) are coupled to system 600. I/O devices 608a-b may be coupled to system 600 directly or indirectly through intervening I/O controllers (not shown).

In the implementation, a network adapter 610 is coupled to system 600 to enable system 600 to become coupled to other data processing systems or remote printers or storage devices through communication link 612. Communication link 612 can be a private or public network. Modems, cable modems, and Ethernet cards are just a few of the currently available types of network adapters.

While various implementations for saving and restarting discrete event simulations have been described, the technical scope of this disclosure is not limited thereto. For example, this disclosure is described in terms of particular systems having certain components and particular methods having certain steps in a certain order. One of ordinary skill in the art, however, will readily recognize that the methods described herein can, for instance, include additional steps and/or be in a different order, and that the systems described herein can, for instance, include additional or substitute components. Hence, various modifications or improvements can be added to the above implementations and those modifications or improvements fall within the technical scope of this disclosure.

The invention claimed is:

1. A method for saving and restarting discrete event simulations, the method comprising:
   performing a discrete event simulation of a scenario via a process executing on a system, wherein the process includes one or more application threads to emulate parallelism, wherein the one or more application threads include a memory stack that executes code;
   responsive to a command to save the discrete event simulation of the scenario up to a point in time,
      creating a checkpoint of the process at the point in time to capture the discrete event simulation of the scenario up to the point in time, the checkpoint comprising data elements of the process that are stored in components of the system at the point in time which reflect a state of the process at the point in time; and
      saving the checkpoint to one or more files in the system, the one or more files being usable to later restart the discrete event simulation of the scenario from the point in time.

2. The method of claim 1, wherein the scenario comprises a plurality of entities and a plurality of events, each of the plurality of events involving one or more of the plurality of entities.

3. The method of claim 2, wherein each of the plurality of entities in the scenario is a part of an integrated circuit design.

4. The method of claim 1, wherein the system is a computer and components of the system comprise two or more of a memory, a register, a file handle, a socket, and a buffer of the computer.

5. The method of claim 1, wherein the command to save the discrete event simulation of the scenario up to the point in time is read from a file.

6. The method of claim 1, wherein the one or more files to which the checkpoint is saved are executable files and the method further comprises:
   executing the one or more files to restart the discrete event simulation of the scenario from the point in time responsive to a command to restart the discrete event simulation of the scenario from the point in time.

7. The method of claim 6, wherein execution of the one or more files results in a new process executing on the system, the new process comprising one or more application threads, the new process and the one or more application threads of the new process replicating the state of the process and the one or more application threads of the process at the point in time when the checkpoint was created.

8. The method of claim 6, wherein the command to restart the discrete event simulation of the scenario from the point in time is read from a file.

9. The method of claim 6, wherein the discrete event simulation of the scenario is restarted from the point in time with at least one parameter of the scenario having a value that is different from a value assigned to the at least one parameter during the discrete event simulation of the scenario from which the checkpoint was created.

10. A non-transitory computer-readable medium containing program instructions for saving and restarting discrete event simulations, wherein execution of program instructions by one or more processors of a computer system causes the one or more processors to carry out the steps of storing executable program code, which when executed, performs the method of claim 1.

11. A system for saving and restarting discrete event simulations, the system comprising:

a processor; and a memory device coupled to the processor, said memory device storing an application which, when executed by the processor, causes the processor to:

execute a simulator as a first process, the simulator performing a discrete event simulation of a scenario, wherein the first process includes one or more application threads to emulate parallelism, wherein the one or more application threads include a memory stack that executes code; and execute a checkpoint creator as a second process, wherein responsive to a command to save the discrete event simulation of the scenario up to a point in time, the checkpoint creator further:

creates a checkpoint of the first process at the point in time to capture the discrete event simulation of the scenario up to the point in time, the checkpoint comprising data elements of the first process and the one or more application threads of the first process that are stored in components of the system at the point in time which reflect a state of the first process at the point in time; and saves the checkpoint to one or more files in the system, the one or more files being usable to later restart the discrete event simulation of the scenario from the point in time.

12. The system of claim 11, wherein the scenario comprises a plurality of entities and a plurality of events, each of the plurality of events involving one or more of the plurality of entities.

13. The system of claim 12, wherein each of the plurality of entities in the scenario is a part of an integrated circuit design.

14. The system of claim 11, wherein the command to save the discrete event simulation of the scenario up to the point in time is read from a file stored in the system.

15. The system of claim 11, wherein the one or more files to which the checkpoint is saved are executable files and responsive to a command to restart the discrete event simulation of the scenario from the point in time, the one or more files are executed to restart the discrete event simulation of the scenario from the point in time.

16. The system of claim 15, wherein execution of the one or more files results in a new process executing on the computer, the new process comprising one or more application threads, the new process and the one or more application threads of the new process replicating the state of the first process and the one or more application threads of the first process at the point in time when the checkpoint was created.

17. The system of claim 15, wherein the command to restart the discrete event simulation of the scenario from the point in time is read from a file stored in the system.

18. The system of claim 15, wherein the discrete event simulation of the scenario is restarted from the point in time with at least one parameter of the scenario having a value that is different from a value assigned to the at least one parameter during the discrete event simulation of the scenario from which the checkpoint was created.

19. The system of claim 11, wherein the first process and the second process are combined into a single process.

\* \* \* \* \*